(12) United States Patent
Ho et al.

(10) Patent No.: US 10,609,309 B1
(45) Date of Patent: Mar. 31, 2020

(54) COMBINED VISIBLE AND INFRARED IMAGE SENSOR INCORPORATING SELECTIVE INFRARED OPTICAL FILTER

(71) Applicant: OmniVision Technologies, Inc., Santa Clara, CA (US)

(72) Inventors: Tawei Ho, Cupertino, CA (US); Chen-Wei Lu, San Jose, CA (US); Cheng-ming Liu, Fremont, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 87 days.

(21) Appl. No.: 16/106,373

(22) Filed: Aug. 21, 2018

Related U.S. Application Data

(63) Continuation-in-part of application No. 15/620,757, filed on Jun. 12, 2017, now Pat. No. 10,425,597.

(51) Int. Cl.
*H04N 5/33* (2006.01)

(52) U.S. Cl.
CPC .................... *H04N 5/332* (2013.01)

(58) Field of Classification Search
CPC .... H04N 5/332; H04N 5/2256; H04N 5/2254; H04N 5/23245; H04N 5/04553; H04N 5/045
See application file for complete search history.

(56) References Cited

U.S. PATENT DOCUMENTS

| 7,330,649 | B2 | 2/2008 | Finizio et al. |
| 7,365,771 | B2 | 4/2008 | Kahn et al. |
| 8,408,821 | B2 | 4/2013 | Wu et al. |
| 9,535,197 | B2 | 1/2017 | Cha et al. |
| 9,898,117 | B2* | 2/2018 | Sargent ............. G06K 9/00355 |
| 2016/0170105 | A1* | 6/2016 | Nagaya ................ G02B 5/22 359/885 |
| 2017/0140221 | A1 | 5/2017 | Ollila et al. |
| 2018/0176487 | A1 | 6/2018 | Price et al. |
| 2018/0180477 | A1* | 6/2018 | Nieten ................ G01J 3/4406 |

\* cited by examiner

*Primary Examiner* — Oschta I Montoya

(57) ABSTRACT

A pixel array comprise a green pixel comprising a first green optical filter and a first clear filter, a red pixel comprising a red optical filter and a first special filter, a blue pixel comprising a blue optical filter and a second special filter, and an IR pixel comprising an IR optical filter and one of a second green optical filter and a second clear filter, where the first special filter suppresses a transmission of IR at a stopband centered at 850 nm at a first IR minimum transmission, and the second special filter suppresses a transmission of IR at the stopband centered at 850 nm at a second IR minimum transmission, and where the first minimum IR transmission is different from the second minimum IR transmission.

17 Claims, 13 Drawing Sheets

COMBINED VISIBLE AND INFRARED IMAGE SENSOR INCORPORATING SELECTIVE INFRARED OPTICAL FILTER

CROSS-REFERENCE TO RELATED APPLICATION

This application is a continuation-in-part of U.S. patent application Ser. No. 15/620,757, filed Jun. 12, 2017.

TECHNICAL FIELD

This disclosure relates generally to image sensor systems that includes a hybrid image sensor pixel array of both visible (VIS) spectrum pixels and infrared (IR) spectrum pixels. More specifically, the image sensor system uses its VIS image sensing capability to produce a VIS color image, and uses its IR sensing capability to perform IR imaging functions.

BACKGROUND INFORMATION

Recent development in the image sensing field has resulted in image sensors that feature security and machine vision applications, including gesture sensing, depth analysis, iris detection, eye tracking, night or low light vision, etc. In one aspect, these image sensors use traditional, VIS spectrum image sensing pixels to produce VIS images. In another aspect, these sensors also use additional, IR spectrum pixels to produce IR images. Basically, these sensors serve a dual purpose of producing both VIS and IR images.

Conventionally, such a dual purpose image sensor employs a direct combination design wherein an IR sub-sensor is physically juxtaposed next to a VIS sub-sensor. The VIS sub-sensor only includes VIS imaging pixels, and the IR sub-sensor only includes IR imaging pixels. This design offers simplicity, but the VIS and IR sub-sensors inevitably have different vantage points with regard to an imaging target. As a result, the resulting VIS and IR images not only have different optical spectra (VIS versus IR), but are also not able to be completely superimposed onto each other. This creates difficulties for subsequent image processing.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
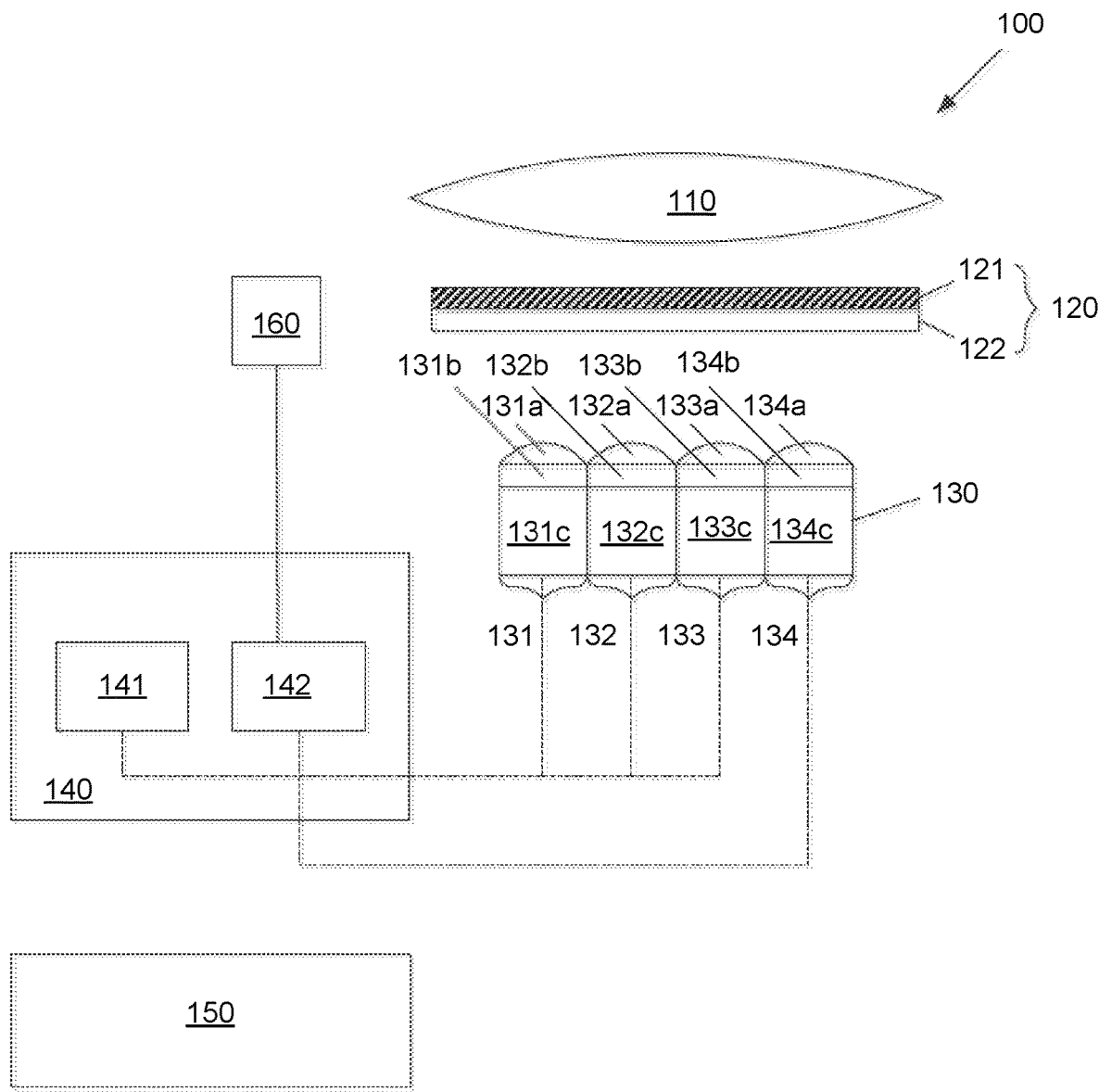
FIG. 1A is schematic drawing showing an exemplary embodiment of a hybrid VIS-IR image sensor system.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "example" or "embodiment" means that a particular feature, structure, or characteristic described in connection with the example is included in at least one example of the present invention. Thus, the appearances of "example" or "embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

First Embodiment: Hybrid VIS-IR Image Sensor System

FIG. 1A is a schematic drawing of an embodiment of a hybrid VIS-IR image sensor system 100, which includes a main lens 110, a VIS-IR bandpass filter module 120, a VIS-IR image sensor pixel array 130, a controller module 140, a function logic module 150, and an IR light source module 160. Features and functions of each element are disclosed further herein.

The main lens 110 focuses incoming light to pass through the VIS-IR bandpass filter module 120, onto the underlying VIS-IR image sensor pixel array 130. As an example, the main lens 110 is optically transparent, and allows all VIS-IR spectrum light to pass through. In other words, the main lens 110 does not have an IR attenuation (IR cut) function.

The VIS-IR bandpass filter module 120 includes a VIS-IR bandpass filter (or filters) 121 that is attached to either the front side and/or the backside of a cover glass substrate 122. The cover glass substrate 122 provides a mechanical support of the VIS-IR bandpass filter 121, and is preferred to be optically transparent to allow the passage of the full spectrum of both VIS and IR light. The VIS-IR bandpass filter 121 is preferably a multi-layer structure consisting of multiple, alternating layers of transparent inorganic materials (e.g., silicon oxide and titanium oxide), and relies on the principle of destructive interference to stop certain spectral bands of incoming light, while allowing other spectral bands to pass through. In the current exemplary embodiment, the VIS-IR filter 121 as illustrated in FIG. 1A allows a VIS band and an IR band to pass through, while stopping the other wavelengths. This is shown in FIG. 2A, and is further elaborated below.

Figure 2A:
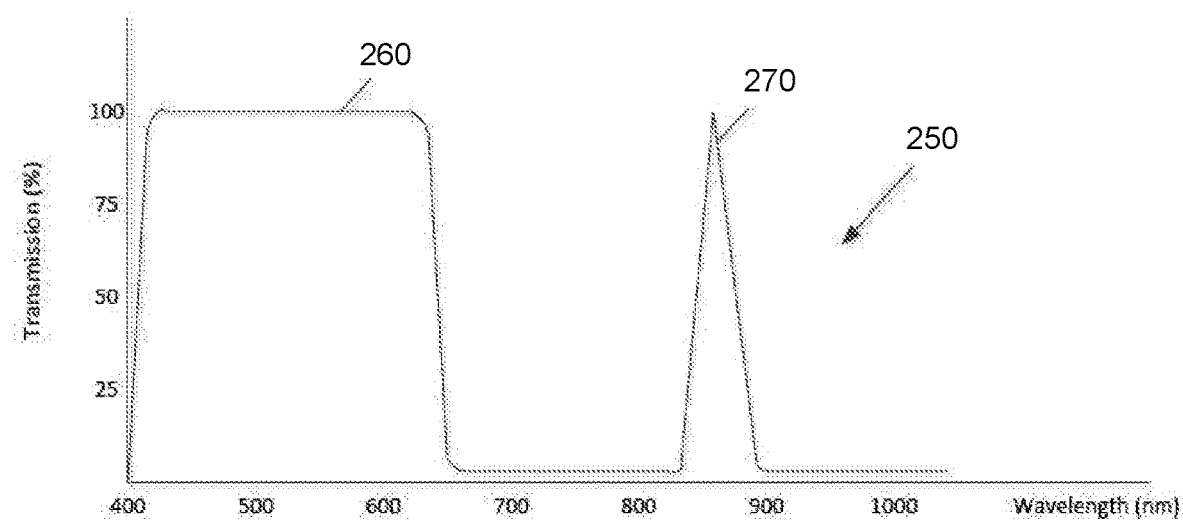
FIG. 2A is a wavelength versus transmission plot that shows a characteristic optical transmission curve of a VIS-IR bandpass filter.
Figure 2B:
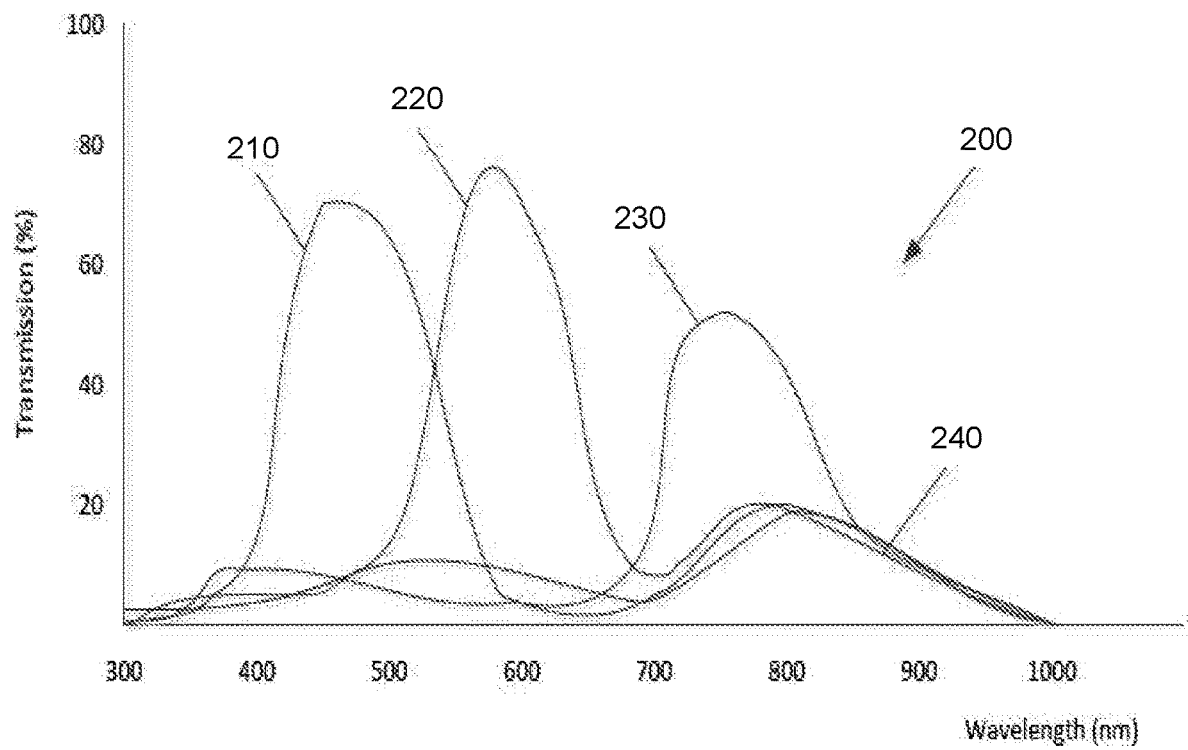
FIG. 2B is a wavelength versus transmission plot that shows a set of characteristic optical transmission curves of the pixels within a VIS-IR pixel array.

Referring to FIG. 2A as an example, it shows a characteristic wavelength-versus-transmission curve 250 of the VIS-IR bandpass filter 121. The transmission curve 250 includes a VIS passband 260 of approximately 400-650 nanometer (nm) wavelength in the VIS range. Note that the shape of the VIS passband 260 has the general form of a rectangle (or close to a trapezoid with two steep sides, i.e., the two base angles of the trapezoid are slightly under 90 degrees), with a height of almost 100% transmission, and it has almost no leakage outside the passband 260. In other words, the VIS passband 260 is close to the ideal passband for the situation of passing a wavelength range. This near ideal passband characteristic is achieved through the use of destructive interference produced by the multi-layer transparent inorganic materials. It is appreciated that such a near-rectangular, no-leak passband characteristic is different from a bell-curve-shaped and leaky passband characteristic that results from an absorption by organic compounds, as shown in FIG. 2B, a point that will be further elaborated later in this disclosure.

The wavelength-transmission curve 250 also includes an IR passband 270 of approximately 800-900 nm wavelength in the IR range. Note again that the shape of the IR passband 270 has the form of a steep triangle (whose two base angles are slightly under 90 degrees), which centers around 850 nm, and it has almost no leakage outside the IR passband 270, i.e., the IR passband 270 is close to the ideal passband for the situation of passing a singular wavelength (at around 850 nm). This near ideal passband characteristic is again achieved through the use of destructive interference produced by multi-layer transparent inorganic materials.

It is appreciated that the characteristic curve 250 in FIG. 2A shows two passbands—a VIS passband 260 and an IR passband 270. As a result, the VIS-IR filter 121 may be referred to as a dual bandpass filter, which functions to pass incoming light at a broad VIS range (400-650 nm) and a narrow IR range (850±50 nm, or 800-900 nm). In other examples, the IR range may be even narrower, e.g., 850±30 nm, 850±10 nm, and so on. Other wavelengths are stopped by this VIS-IR filter 121.

It is appreciated that the aforementioned passband values that are achieved by destructive interference produced by multi-layer transparent inorganic materials is dependent on the chief ray angle (CRA) of the incident light. This is due to the nature of destructive interference, which involves light reflecting off the interfaces of the multi-layer transparent materials. As an example, at a CRA of zero degrees (incoming light vertical to the incident plane, and is contained in the normal plane), the narrow IR passband is about 850±50 nm, i.e., 800-900 nm, as previously disclosed. In contrast, at a CRA of 30 degrees (light coming in obliquely at an angle, and is off the normal plane by 30 degrees), the IR passband shifts to a new range of 825±45 nm, or 780-870 nm. This passband dependency on CRA will have ramifications on the image sensor system design, and will be brought up again later in this disclosure.

Figure 1B:
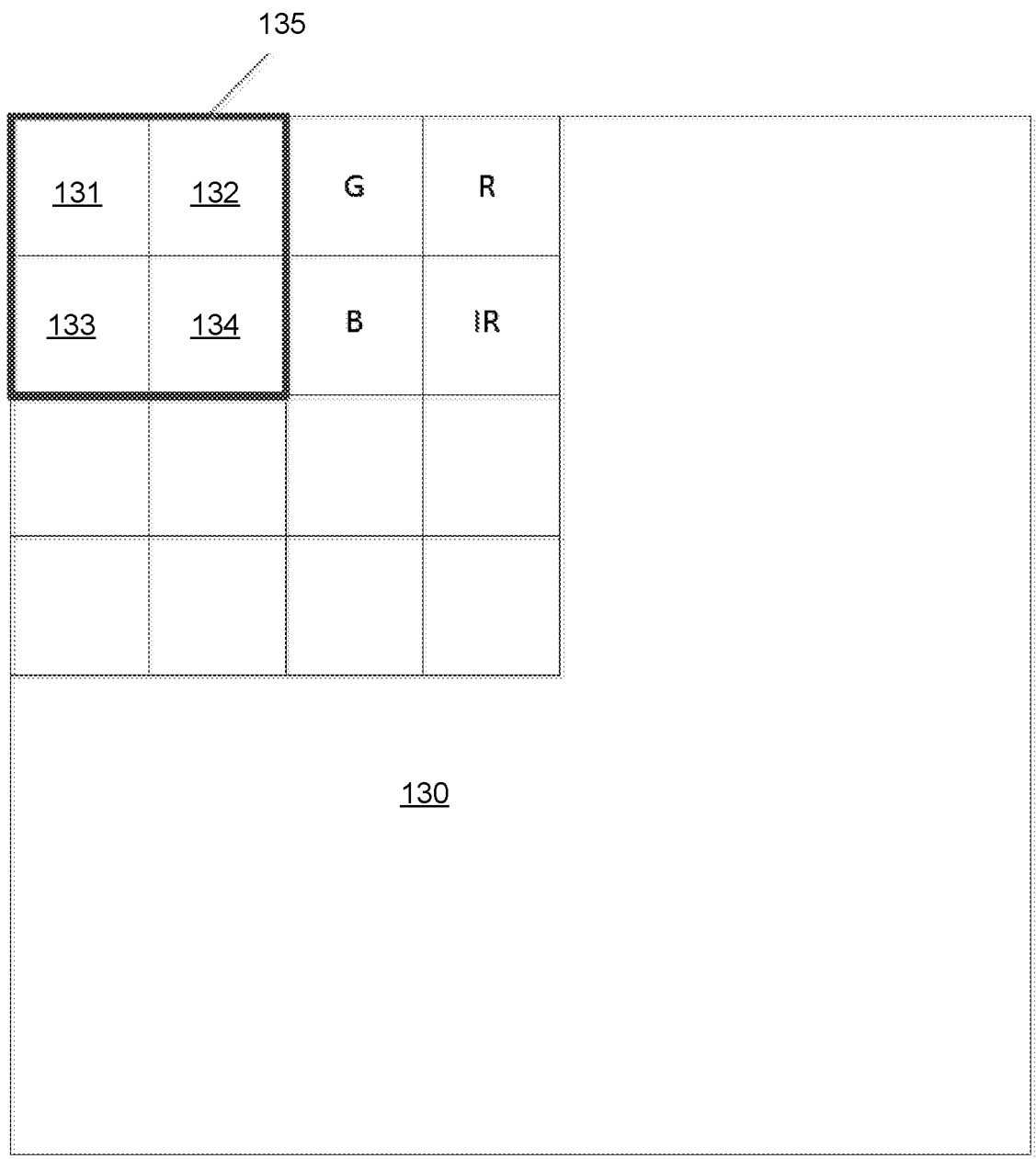
FIG. 1B is top view of an exemplary VIS-IR image sensor pixel array, showing a minimal repeating unit containing individual pixels.

Referring now to FIG. 1A, the VIS-IR image sensor pixel array 130 is situated below the VIS-IR bandpass filter module 120. The pixel array 130 comprises a multitude of VIS and IR pixels, wherein a group of VIS and IR pixels form a multiple repeating unit 135, which is shown in FIG. 1B as part of a top view of the pixel array 130. A minimal repeating unit is defined as the smallest group of pixels that make up an entire pixel array. According to FIG. 1B, the minimal repeating unit 135 of pixel array 130 consists of a green (G) pixel 131, a red (R) pixel 132, a blue (B) pixel 133, and an IR pixel 134, arranged in a square-shaped, 2×2 pattern.

FIG. 1A shows a cross-sectional side view of (a representative portion of) the pixel array 130, which comprises the four individual pixels 131 through 134. For illustrative purposes, only four pixels 131 (G), 132 (R), 133 (B), and 134 (IR) are shown in the pixel array 130. In reality, the pixel array 130 includes many more individual pixels that may have different arrangements. All four pixels 131, 132, 133, and 134 share similar features, and are disclosed herein by describing the green (G) pixel 131 as a representative pixel.

The G pixel 131 includes a microlens 131a, a G optical filter 131b, and an image sensing member 131c. The microlens 131a may be made of a resin material, and primarily functions to concentrate incoming light into the pixel 131 itself. The G optical filter 131b contains organic material, and relies on chemically based optical absorption principle to pass a particular wavelength band of light while stopping other wavelengths. In this example, the G optical filter 131b passes a green wavelength band of about 450-650 nm.

FIG. 2B shows a wavelength-versus-transmission set of curves 200 that includes a G bandpass characteristic curve 220, which corresponds to the G optical filter 131b. The G curve 220 includes a main color G bandpass range of about 450-650 nm, but also has significant leakage ranges outside the 450-650 nm main passband, for example, in the 300-450 nm range, and also in the near-IR and IR range of 700-1100 nm. The leakage range is due to the nature of the chemically based optical absorption. Within the 450-650 nm main color G passband, the appearance of the curve is similar to a partially skewed and non-smooth bell-curve shape. This non-ideal passband shape is also due to the chemically based optical absorption. These characteristics are different from the near ideal characteristics of the VIS-IR bandpass filter 121 as disclosed in FIG. 2A and its related description. It is appreciated that whereas a multi-layer optical filter that relies on destructive interference is applicable for large size (millimeter scale and above) optical filters such as filter 121, this type of optical filter design is generally not feasible to make the optical filter for a small image sensor pixel (micrometer scale or less), such as pixel 131. Instead, an organic compound filter that relies on chemically based optical absorption is more suitable for small size optical filters such as filter 131b, because the requisite manufacturing process (e.g., photolithography, spin coating, and drying) can be readily applied to make small, micrometer (or sub-micron) size filters.

Returning to FIG. 1A, the G pixel 131 includes the image sensing member 131c directly below the G optical filter 131b. The image sensing member 131c may be of a CMOS (Complementary Metal Oxide Semiconductor) or CCD (Charge Coupled Device, similar to CMOS, but with minor variations) configuration. For example, in a CMOS configuration, the sensing member 131c is made with a silicon substrate (not labeled), into which a photodiode (not shown) is formed. Other parts such as a photodiode pinning layer (not shown), a well structure (not shown) around the photodiode, and isolation trenches (not shown) may also be present. These parts work to produce photoelectric signals based on the photoelectric effect. Various transistor gates (transfer gate, reset gate, source follower, and row select), floating nodes, and electrical wirings are useful to amplify and relay optoelectronic signals to be processed later, but are also not shown.

Similar to the above description of the G pixel 131, other pixels such as the R pixel 132, the blue pixel 133, and the IR pixel 134 each include their requisite microlenses (132a, 133a, and 134a), optical filters (132b, 133b, and 134b), and image sensing members (132c, 133c, and 134c). In particular, the optical filters 131b, 132b, 133b, and 134b each has its own specific characteristic transmission curve, i.e., a G transmission curve 220, an R transmission curve 230, a B transmission curve 210, and an IR transmission 240, respectively, as shown in FIG. 2B. These optical filters rely on chemically based optical absorption, and their characteristic curves have leakage ranges beyond their main spectral passbands, as well as having skewed and non-smooth bell-curve shapes within their main spectral passbands.

It is appreciated that in the above embodiment, the primary passband for the G transmission curve 220 is around 450-650 nm (with about 80% peak transmission); the primary passband for the R transmission curve 230 is around 650-850 nm (with about 50% peak transmission); the primary passband for the B transmission curve 210 is around 380-450 nm (with about 70% peak transmission); and the primary passband for the IR transmission curve 240 is around 800-1000 nm (with about 20% peak transmission), wherein the primary IR passband overlaps with the primary passband of the R transmission curve 230 at around 800-850 nm.

In addition, each of the three VIS transmission curves (the G curve 220, the R curve 230, and the B curve 210) contains one or several leaky passbands outside its respective main spectral passband, e.g., a leaky band being situated around the near-IR and IR range of 700-1100 nm, with a peak transmission value of around 20%. This means that each VIS pixel (R, G, and B) is capable of detecting IR light to some degree.

Figure 2C:
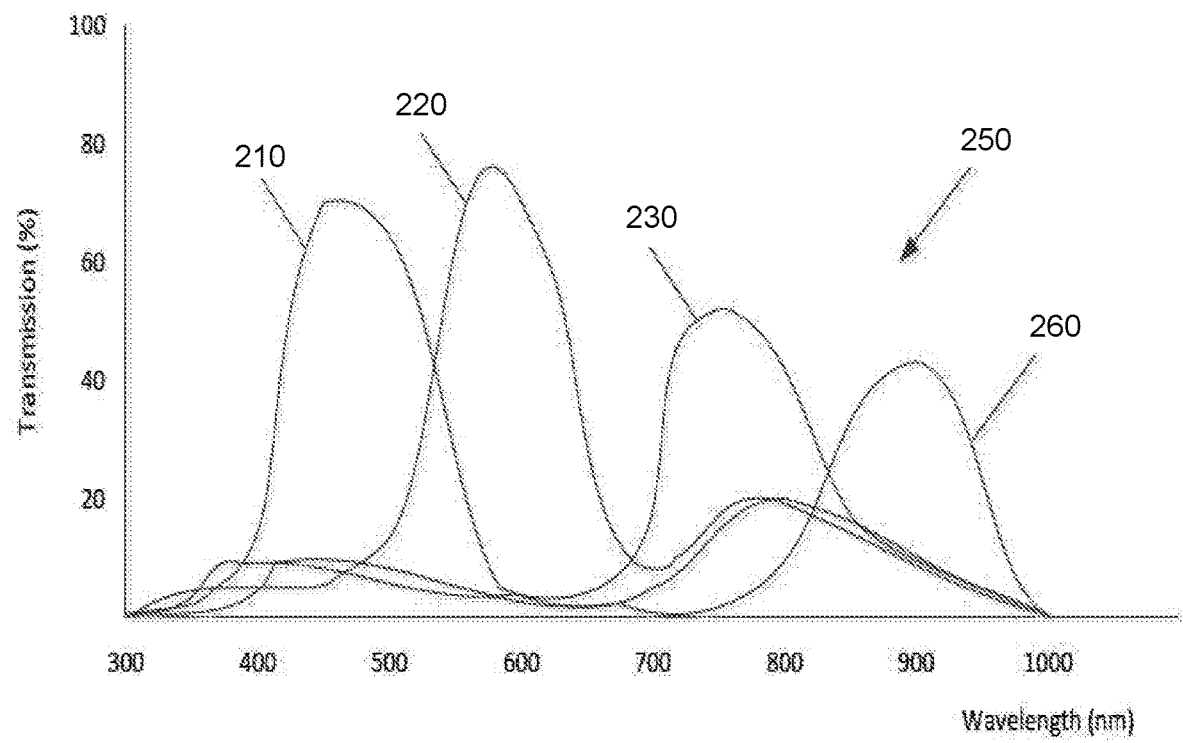
FIG. 2C is another wavelength versus transmission plot that shows another set of characteristic optical transmission curves of the pixels within another VIS-IR pixel array.

FIG. 2C shows an alternative wavelength-versus-transmission set of curves 250. This set of curves 250 are similar to the set of curves 200 in FIG. 2B, except for the IR curve 260 that has a much higher transmission level than the previous IR curve 240 found in FIG. 2B. Both IR curves 240 and 260 have their main spectral passband situated around 800-1000 nm, but curve 260 has a peak transmission level of around 50%, which is much higher than the 20% of curve 240.

Controller module 140 may be physically and electrically coupled with the VIS-IR image sensor pixel array 130, as shown in FIG. 1A, and operates the hybrid VIS-IR image sensor system to select among a number of operating modes. In an embodiment, these modes include (1) a VIS vision mode, which is generally appropriate for human vision; and (2) an IR vision mode, which is generally appropriate for security vision, machine vision and night vision. In such an embodiment, the controller module 140 includes a VIS vision mode control sub-module 141 that controls the VIS vision mode, and an IR vision mode control sub-module 142 that controls the IR vision mode. As an example, the VIS control sub-module 141 selectively controls the VIS pixels (e.g., pixels 131, 132 and 133) of the pixel array 130, as shown by the dotted lines connecting pixels 131, 132, and 133 with the VIS control sub-module 141. The IR control sub-module 142 selectively controls the IR pixels (e.g., pixel 134) of the pixel array 130, as shown by a dotted line connecting pixel 134 with the IR control sub-module 142. It is appreciated that the aforementioned control of the pixel array 130 by the controller module 140 is optional.

Function logic module 150 receives image signals (not shown) that are read out from the pixel array 130, and processes these signals into images, e.g., VIS and IR images. VIS pixel signals are used to produce VIS images, and IR signals are used to produce IR images. Image processing is conventionally performed by an image signal processor (ISP, not shown) as part of the function logic module 150.

IR light source module 160 operates to illuminate an imaging object with IR spectral light. In an example, the IR light source module 160 is an IR light emitting diode (LED) that emits a relative narrow spectral range of IR light at around 850 nm, with a tolerance of around plus and minus 50 nm, 30 nm, 10 nm, or even less. The emitted IR light of 850±50 nm may be continuous, or in rapid, intense pulses (e.g., MHz pulsing frequency, with each pulse period at nanosecond scale). In an embodiment as shown in FIG. 1A, during the IR vision mode, the IR control sub-module 142 controls the IR light source module 160 to emit pulses of IR light at about 850 nm.

The workings of the VIS and IR vision modes are disclosed herein. When the IR mode is selected for machine vision or night vision application, the IR control sub-module 142 is engaged to control the IR light source module 160 to emit rapid pulses of intense IR light of about 850±50 nm (tolerance may be less than 50 nm, e.g., 30 nm, 10 nm, etc.) to illuminate an imaging subject. This illuminating IR light has sufficient power to overwhelm naturally occurring ambient light. This operation scheme is effective in both day and night, but is especially effective during the night (or in a foggy environment) when there is low ambient natural light. The light reflected off the imaging subject contains a high percentage of IR spectral component of about 850±50 nm (tolerance may be less than 50 nm), and other less significant spectral components (such as VIS spectra) are regarded as noise. Hence this reflected light is essentially an IR light of about 850±50 nm (tolerance may be less than 50 nm). The aforementioned reflected IR light passes through the main lens 110 without any significant optical filtration. As this IR light continues to pass through the VIS-IR dual bandpass filter module 120, the narrow 850±50 nm (tolerance may be less than 50 nm) IR passband 270 (shown in FIG. 2B), which overlaps, or fully includes the reflected IR spectral range of 850±50 nm (tolerance may be less than 50 nm), allows most of this reflected IR light to pass through without significant loss, to continue on to reach the underlying pixel array 130.

It is appreciated that the VIS-IR bandpass filter 120 has a narrow IR passband whose center coincides with the center of the spectral range of the IR light that is emitted by the light source 160, e.g., a 850 nm center. It is also appreciated that the IR passband 270 as shown in FIG. 2A is wide enough (i.e., has enough tolerance around its center) to permit most of the IR light reflecting off the imaging subject to pass through. It is further appreciated that the IR passband 270 is not exceedingly wide to permit too much noise to pass through. As an illustrative example, the light source 160 emits IR light with a spectral range of about 850±40 nm, and the VIS-IR bandpass filter 120 has a corresponding IR passband of about 850±50 nm.

In the IR vision mode, the pixel array 130 essentially functions as an IR sensor array that relies on its IR pixels 134 to produce IR signals. In an embodiment, the VIS pixels 131, 132 and 133 are not engaged to operate in this IR vision mode, and only the IR pixels 134 are controlled by the IR control sub-module 142 to engage in operation. See FIG. 1A for control lines connecting the control module 140 to the pixel array 130. The VIS control sub-module 141 disengages the VIS pixels 131, 132, and 133. In an alternative where selection by sub-modules 141 and 142 is optional, both VIS and IR pixels are engaged to operate, but due to the high percentage of IR component of the light that falls on the pixel array 130, the signal output is primarily IR signals. As a result, the pixel array 130 functions essentially as an IR sensor. IR machine vision mode may be useful in applications such as distance measurement, movement tracking, etc.

When VIS vision mode is selected for human vision, the control module 140 may be engaged to suppress the IR light source module 160 so that it does not emit IR light. The VIS-IR image sensor system 100 now depends on natural lighting to illuminate the imaging subject. Incoming natural light (not shown in FIG. 1A) generally contains all VIS spectrum light, as well as some naturally occurring IR spectrum light. The incoming natural light passes through the main lens 110 without any significant optical filtration. As the incoming light continues to pass through the VIS-IR dual bandpass filter module 120, the broad 400-650 nm VIS passband 260 (shown in FIG. 2B) allows the VIS light in the main spectral range 400-650 nm to pass through, while the narrow 850±50 nm IR passband 270 (shown in FIG. 2B) allows only a small amount of naturally occurring IR light that is in the narrow spectral range of 850±50 nm to pass through. Other spectra of incoming light, including most of the IR outside the 850±50 nm range, are filtered out. The unfiltered VIS and IR portions of the incoming light continue to reach the underlying pixel array 130.

The pixel array 130 functions as a regular RGB sensor array to produce VIS image signals (R, G, and B signals). In an embodiment, the VIS control sub-module 141 engages the VIS pixels 131, 132, and 133 to operate to produce VIS imaging signals, while the IR control sub-module 142 disengages the IR pixels 134 from operating. In an alternative where selection by sub-modules 141 and 142 is optional, all VIS and IR pixels 131, 132, 133, and 134 are allowed to operate, but the output from the IR pixels 134 is not directly used to form a final color image. The VIS pixels 131, 132, and 133 produce RGB signals, wherein the functional logic module 150 uses these RGB signals to produce a final color image after regular image processing steps such as interpolation.

The IR component within the filtered incoming light does affect the RGB signals to some degree. For example, as shown in FIG. 2B, the R transmission curve 230 of the R color filter 132b, the G transmission curve 220 of the G color filter 131b, and the B transmission curve 210 of the B color filter 133b each contain a leaky passband in the IR range of about 700-1100 nm, which is wider than the 850±50 nm passband of the overlying VIS-IR dual passband filter module. Therefore, the RGB signals that are produced by the VIS pixels 131, 132, and 133 each contain some IR components (at 850±50 nm) in them. These are regarded as IR noise.

Advanced signal processing may be used to remove these IR components, but this removal may be effective only in some circumstances. As an example, when the optical filters 131b, 132b, 133b, and 134b have the optical transmission characteristics as shown in FIG. 2B, the IR pixel 134 may be set to operate at the same time as the VIS pixels 131, 132, and 133. The IR signal produced by the IR pixel 134 may then be used as a corrective baseline to subtract the IR components (at 850±50 nm) from the VIS signals produced by the VIS pixels 131, 132, and 133, such than the VIS signals may be accurately corrected to remove IR noise.

However, in some situations, an accurate removal of IR noise is not possible. For example, when the optical filters 131b, 132b, 133b, and 134b have the transmission characteristics as shown in FIG. 2C, wherein the IR transmission curve 260 is much more pronounced than (or otherwise different from) the IR curve 240 in FIG. 2B, the aforementioned IR correction scheme will become inaccurate and unreliable. This is because the IR signal produced by the IR pixel 134 is much different from (e.g., much higher than) the IR components within the RGB signals that are produced by VIS pixels 131, 132, and 133. This complication cannot be remedied by simply turning off the IR pixel 134 and only engaging the VIS pixels 131, 132, and 133, because the IR influence of the incoming light that falls on these VIS pixels will remain. As a result, the RGB signals will continue to have some IR noise component, such that the final color image may suffer from IR-related artifacts, such as a reddish hue. This reddish hue is especially noticeable when the final color image has an innate blue tone (or other cold tone), as versus a red tone (or other warm tone). This is partly because, among the VIS pixels 131, 132, and 133, the IR noise adversely affects the B pixel 133 and the G pixel 131 more than it affects the R pixel 132. The B and G spectra are further away from IR spectrum than the R spectrum; whereas there is a natural overlap between the R and IR spectra.

It is appreciated that in the aforementioned IR noise problem, the culprit IR noise refers to the IR component that passes through the IR passband 270 of the VIS-IR bandpass filter 120, as shown in FIGS. 1A and 2A. An exemplary IR noise occurs at 850±50 nm (at zero degrees CRA). Another exemplary IR noise occurs at 825±45 nm (at 30 degree CRA).

Second Embodiment: Improved VIS-IR Image Sensor System

Figure 3A:
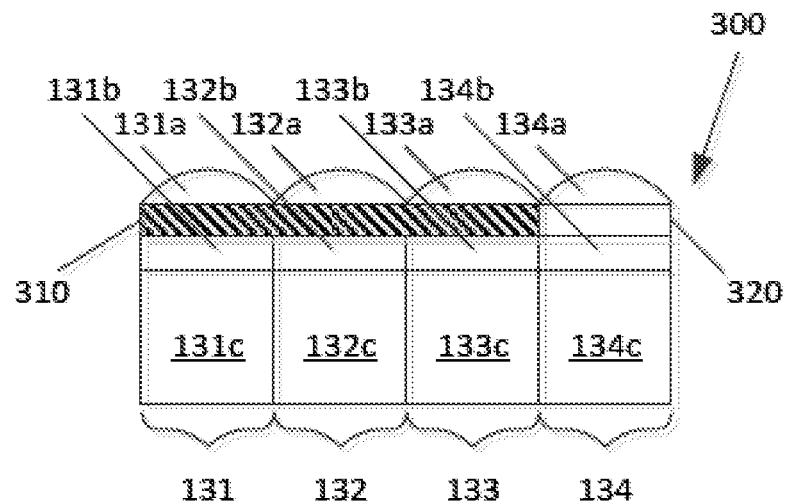
FIG. 3A is a side-view drawing of part of an improved VIS-IR pixel array.

In order to solve the aforementioned IR noise problem relating to the VIS vision mode of operation, an exemplary first improvement is disclosed herein. The basic idea is use some means to stop the incoming IR noise that passes through the IR passband 270 (e.g., around 850±50 nm). FIG. 3A shows the design of such an improvement. An improved VIS-IR image sensor pixel array 300 is an improved version over the original VIS-IR pixel array 130 as shown in FIG.

Figure 3B:
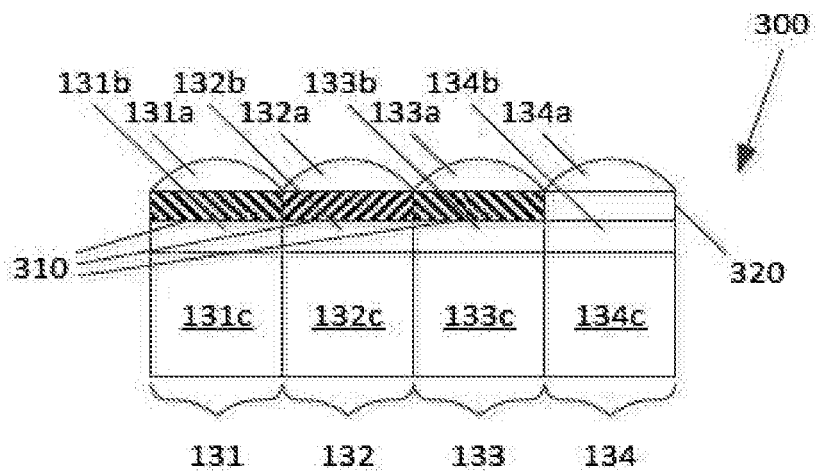
FIG. 3B is another side-view drawing of part of another improved VIS-IR pixel array.

1A. The improved pixel array 300 has the same components as the original pixel array 130, including the microlenses 131a through 134a, the optical filters 131b through 134b, and the image sensing members 131c through 134c. In addition, the improved pixel array 300 includes a selective IR cut filter 310, which is superimposed with, i.e., either overlying above or underlying below (e.g., overlying above) the VIS optical filters 131b, 132b, and 133b. The selective IR filter 310 may be a single unit of filter that overlies above a number of VIS optical filters (e.g., some combination of 131b, 132b, and 133b), or in the alternative as shown in FIG. 3B, it may be a single filter that overlies above a single VIS filter. For such an embodiment, each VIS optical filter has its own corresponding selective IR filter 310, either overlying above or underlying below it. Further, the improved pixel array 300 includes an optional IR pass filter 320, which is superimposed with, i.e., either overlying above or underlying below (e.g., overlying above) the IR optical filter 134b. The features of the selective IR cut filter 310 and the optional IR pass filter 320 are disclosed herein.

The selective IR filter 310 is a notched filter, also known as a bandstop filter, which stops light transmission within a certain stopband (e.g., 850±50 nm), while allowing the rest of the spectrum to pass through it. The selective IR filter 310 contains organic material, which relies on chemically based optical absorption principle to stop a particular wavelength band of light while passing other wavelengths. The term "selective" indicates that the selective IR filter 310 selectively stops IR with a relatively narrow stop band, e.g., around 850±50 nm.

Figure 4A:
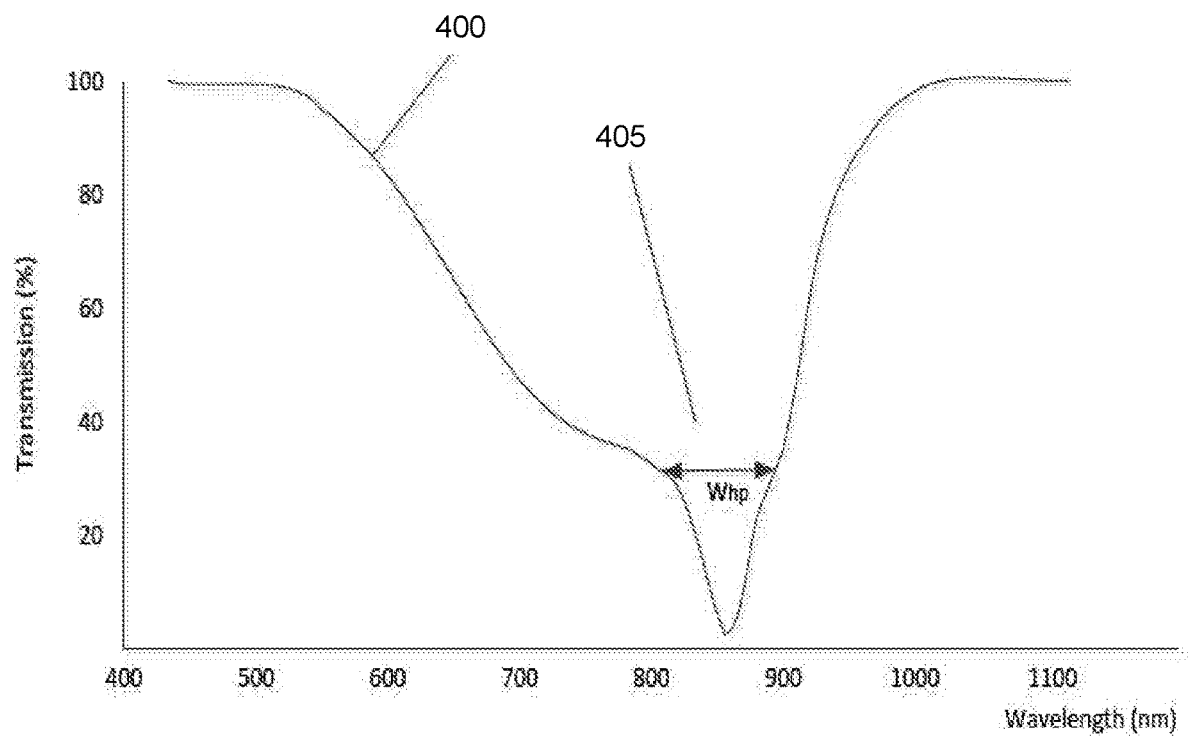
FIG. 4A is a wavelength versus transmission plot that shows a characteristic optical transmission curve of a selective IR filter.

FIG. 4A shows a characteristic light transmission curve 400 of this selective IR filter 310. Since the selective IR filter 310 relies on chemically based optical absorption to stop a certain band of light to pass through, the shape of the stopband 405 is not ideal, and has an appearance that is similar to a partially skewed and non-smooth inverted bell-curve shape. It is appreciated that whereas a multi-layer optical filter based on destructive interference is applicable for large size (millimeter and above) optical filters such as filter 121 (shown in FIG. 1A), such a filter design is generally not feasible to make the optical filter for small image sensor pixels (micrometer scale or below), such as the pixels of the pixel array 300 in FIG. 3A. Instead, an organic compound filter that relies on chemically based optical absorption is more suitable for such a situation, because the requisite manufacturing process (e.g., photolithography, spin coating, and drying) can be readily applied to make small, micrometer (or sub-micron) size optical filters.

According to FIG. 4A, the characteristic transmission curve 400 has a region of stopband 405, which is located at about 550-950 nm. Outside this stopband 405 region, light transmission is relatively high (e.g., 90-100%). Within this stopband 405, light transmission is significantly reduced. Further, at about 850 nm, light transmission is completely stopped. The overall effectiveness of the stopband 405 depends on its bandwidth.

There are a number of ways to quantitatively characterize the bandwidth for the stopband 405. For example, as shown in FIG. 4A, the stopband 405 starts at approximately 550 nm, and ends at approximately 950 nm. However, this characterization of stopband ("apparent stopband") may not reflect the true effectiveness of the stopband 405, because within the stopband 405, the reduction of light transmission is not uniform. In contrast, a half-power assessment appears to be more accurate in quantifying the effectiveness of the stopband 405. Generally speaking, within a half-power bandwidth $W_{hp}$ (shown in FIG. 4A), about half the incoming optical signal energy is stopped by an optical filter. This corresponds to approximately 30% transmission level of the transmission curve 400. From FIG. 4A, the half-power bandwidth $W_{hp}$, may be regarded as the effective bandwidth of the stopband 405, wherein $W_{hp}$ is in the range of 810-880 nm (about 70 nm in width), with 850 nm being the center point at which all light is stopped. Since the stopband 405 is skewed to the high wavelength side, a more accurate way to depict the effective bandwidth $W_{hp}$ of the stopband 405 is to use a three-number notation, 810-850-880 nm, wherein the three numbers each denotes the left end, the center, and the right end of the effective bandwidth region of this stopband.

Referring to FIGS. 3A and 3B that show the selective IR filter 310 overlying directly above the VIS optical filters 131b, 132b, and 133b, an exemplary incoming natural light with VIS spectrum along with IR noise at 850±50 nm first reaches the selective IR filter 310. The stopband 405 as depicted in FIG. 4A has an effective bandwidth of 810-850-880 nm, which essentially overlaps with the IR noise range of 800-850-900 nm (alternative notation of 850±50 nm, indicating left end, center, and right end). In particular, the two centers coincide at 850 nm. In other words, the most effective part of the stopband meets the highest IR noise point. Additionally, the left (800 nm) and right (900 nm) ends of the IR noise range fall only slightly outside the effective bandwidth (810-880 nm) of the stopband 405. Therefore, the selective IR filter 310 appears effective in essentially eliminating the IR noise that will cause a reddish hue in the final color image during the VIS human vision mode.

Turning to the IR pass filter 320 in FIGS. 3A and 3B, it is appreciated that this is an optional element. Since the selective IR filter 310 has been added to the VIS filters 131b, 132b, and 133b, but not to the IR filter 134b, some planarization is needed for the IR filter 134b to increase overall thickness. The IR pass filter 320 provides such a planarization function. In addition, the IR pass filter 320 may be situated either directly above or below the IR filter 134b. The IR pass filter contains organic material that is suitable for small image sensor pixels (micrometer scale or below).

The IR pass filter 320 allows a wide range of IR to pass. Its IR passing range preferably covers the entire IR passing range of its adjoining IR filter 134b, which is depicted to have the characteristic transmission curve 240 in FIG. 2B, or curve 260 in FIG. 2C. The IR passing function of filter 320 may be implemented in a number of ways. First, the IR pass filter 320 may be transparent enough to pass all spectra of VIS and IR (thus making filter 320 an "all-pass" filter, which is essentially a non-filter). Second, filter 320 may be a low-pass filter to only pass the longer wavelength spectrum in the IR range, e.g., approximately 700 nm and above. Third, without implementing the optional IR pass filter 320 at all, the existing IR filter 134b may be simply made thicker (e.g., with additional thickness essentially equal to the thickness of the selective IR filter 310) to achieve planarization with the neighboring VIS filters 131b, 132b, and 133b. Other effective options may exist. Different organic material may be appropriately chosen for each option above, as a person having ordinary skill in the art may recognize.

Figure 5:
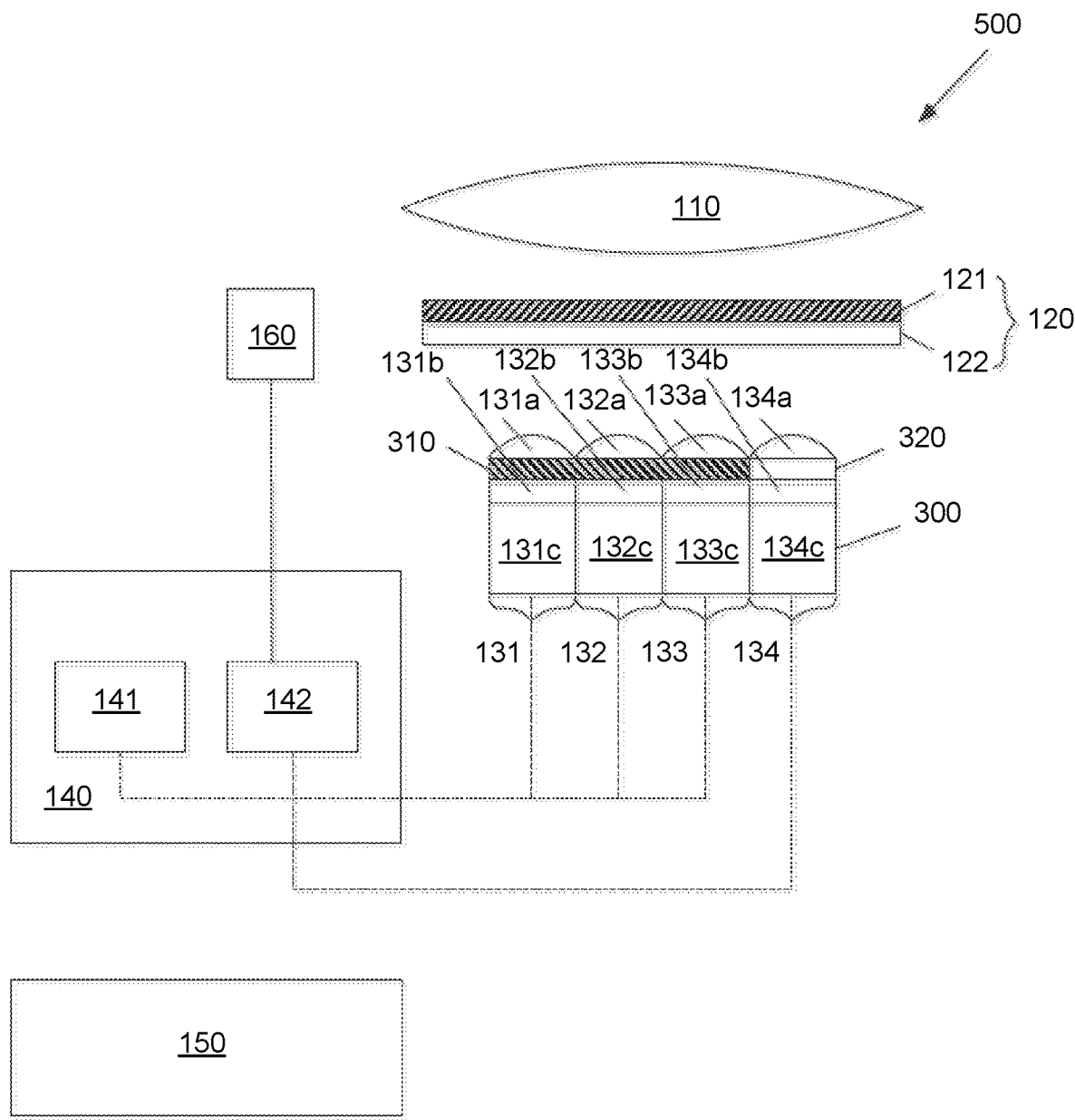
FIG. 5 is schematic drawing showing an exemplary embodiment of a hybrid VIS-IR image sensor system that includes a selective IR filter.

FIG. 5 is a schematic drawing of an improved hybrid VIS-IR image sensor system 500. It is largely similar to the VIS-IR system 100 as shown in FIG. 1A, but includes the selective IR filter 310 and the optional IR pass filter 320 within the improved pixel array 300. Other components remain the same as the original system 100. The presence of the selective IR filter 310 allows the improved hybrid VIS-IR system 500 to reduce IR noise in its final VIS images while engaging in the VIS vision mode. Its IR vision mode remains the same as in the original system 100.

Third Embodiment: Further Improved VIS-IR Image Sensor System

As previously discussed, the VIS-IR filter module 120 is made of multi-layer transparent materials, which uses destructive interference to produce its passbands. As a result, its passbands may shift, depending on the chief ray angle (CRA) of the incoming light. As a particular example, at a CRA of zero degrees, the IR passband 270 as shown in FIG. 2A is about 850±50 nm, i.e., 800-850-900 nm. In contrast, at a CRA of 30 degrees, the IR passband 270 now becomes 825±45 nm, or 780-825-870 nm. This passband dependency on CRA allows IR noise to shift with CRA, thus rendering the selective IR filter less effective at some CRA values than other CRA values, as further explained below.

As previously disclosed, the selective IR filter 310 has an effective stop bandwidth of 810-850-880 nm, which works well for a zero degree CRA incoming IR noise at 800-850-900 nm. However, at a 30 degree CRA, the IR passband 270 of the VIS-IR filter 120 shifts to 825±45 nm, or 780-825-870 nm, hence the incoming IR noise now shifts to a range of 780-825-870 nm. The present selective IR filter will not be very effective to deal with this shifted IR noise. First, the selective IR filter stop bandwidth center of 850 nm no longer coincides with the shifted IR noise center of 825 nm. More significantly, the left end (780 nm) of the shifted IR noise now falls well outside the left end (810 nm) of the selective IR filter stop bandwidth. This means that at a 30 degree CRA, the current selective IR filter 310 will lose some effectiveness to reduce IR noise.

Figure 4B:
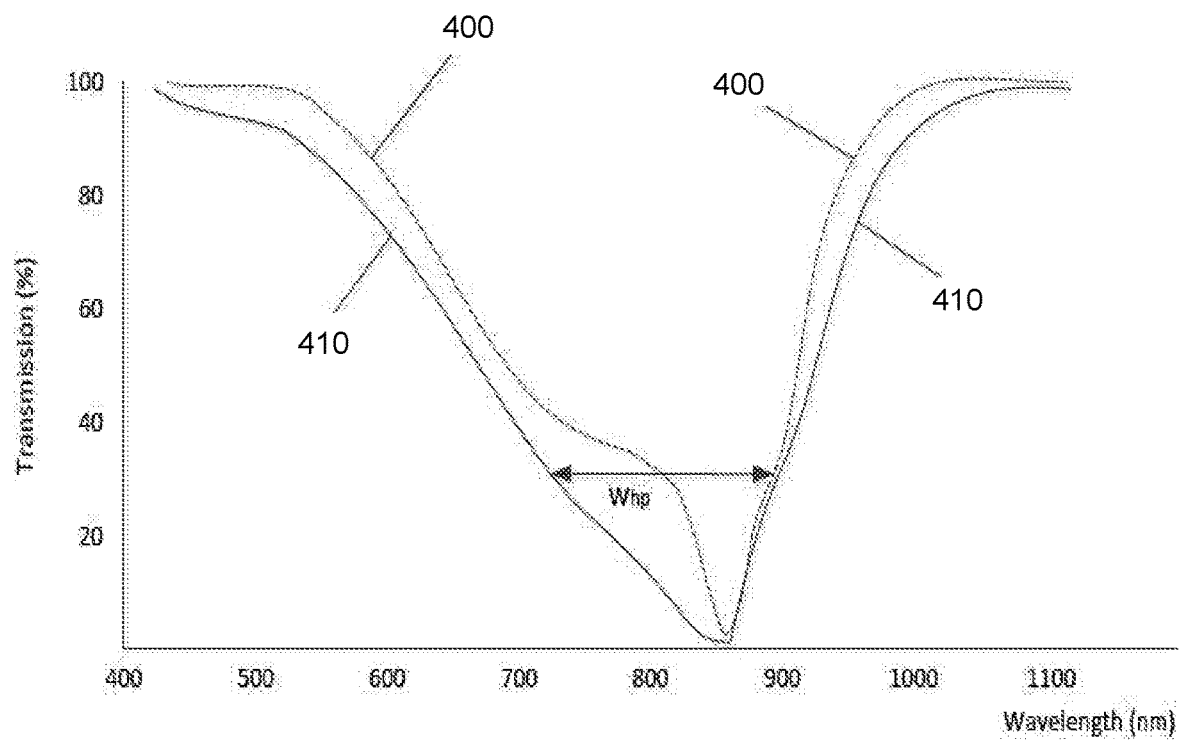
FIG. 4B is another wavelength versus transmission plot that shows two characteristic optical transmission curves of a selective IR filter before and after improvement.

To solve the aforementioned CRA dependent shifting of the IR noise, the selective IR filter 310 is improved by widening the effective bandwidth $W_{hp}$ of its stopband. FIG. 4B illustrates an embodiment of a second improvement to the hybrid VIS-IR system (which is a first improvement to the selective IR filter 310). FIG. 4B shows the original characteristic transmission curve 400 of the selective IR filter 310 before improvement, which is the same as the transmission curve 400 shown in FIG. 4A. An improved characteristic transmission curve 410 is that of the selective IR filter 310 after improvement. Improved curve 410 (solid curve) has a wider effective bandwidth than the original curve 400 (dotted curve). In this embodiment, the improved curve 410 has an effective stop bandwidth of 720-850-880 nm. This widening of effective bandwidth is achieved by modifying the organic material within the selective IR filter 310.

The improved stop bandwidth of 720-850-880 nm is more effective than the pre-improvement bandwidth of 810-850-880 nm to filter out incoming IR noise. The following table compares the two bandwidths quantitatively.

Table 1: comparison of the pre and post improvement stop bandwidth of the selective IR filter

|  | Selective IR Filter | Improved Selective IR Filter |
| --- | --- | --- |
| IR stopband | 810-850-880 nm | 720-850-880 nm |
| 0 deg CRA noise range | 800-850-900 nm (well handled) | 800-850-900 nm (better handled) |
| 30 deg CRA noise range | 780-825-870 nm (not well handled) | 780-825-870 nm (better handled) |

At zero degree CRA, the incoming IR light noise has a range of 800-850-900 nm. The improved selective IR filter stopband of 720-850-880 nm essentially catches all the IR noise range. The stopband center coincides with the noise range center at 850 nm. The left end (800 nm) of the noise range falls fully within the left end (720 nm) of the improved stopband. More impressively, at 30 degree CRA, the incoming IR light noise has a shifted range of 780-825-870 nm, and the left end (780 nm) of this shifted noise range also falls fully within the left end (720 nm) of the improved stopband. This improved stopband of 720-850-880 nm is markedly more advantageous over the previous selective IR filter stopband of 810-850-880 nm.

In summary, the pre-existing selective IR filter 310 is improved by widening its effective IR stopband $W_{hp}$, e.g., from previously 810-850-880 nm to the wider range of 720-850-880 nm. This allows for an improved selective IR filter performance to better handle incident IR noise coming in at different directions, e.g., from zero to 30 degree CRA.

The improved selective IR filter 310 is similarly implemented in the VIS-IR image sensor system 500, as shown in FIG. 5. Previous disclosure still applies, with the exception that the improved selective IR filter 310 now has a wider effective bandwidth (e.g., 720-850-880 nm), and this secondly improved system 500 can better handle incoming IR noise at various CRA angles (e.g., from zero to 30 degrees).

Fourth Embodiment: Methods of Operation

Figure 6:
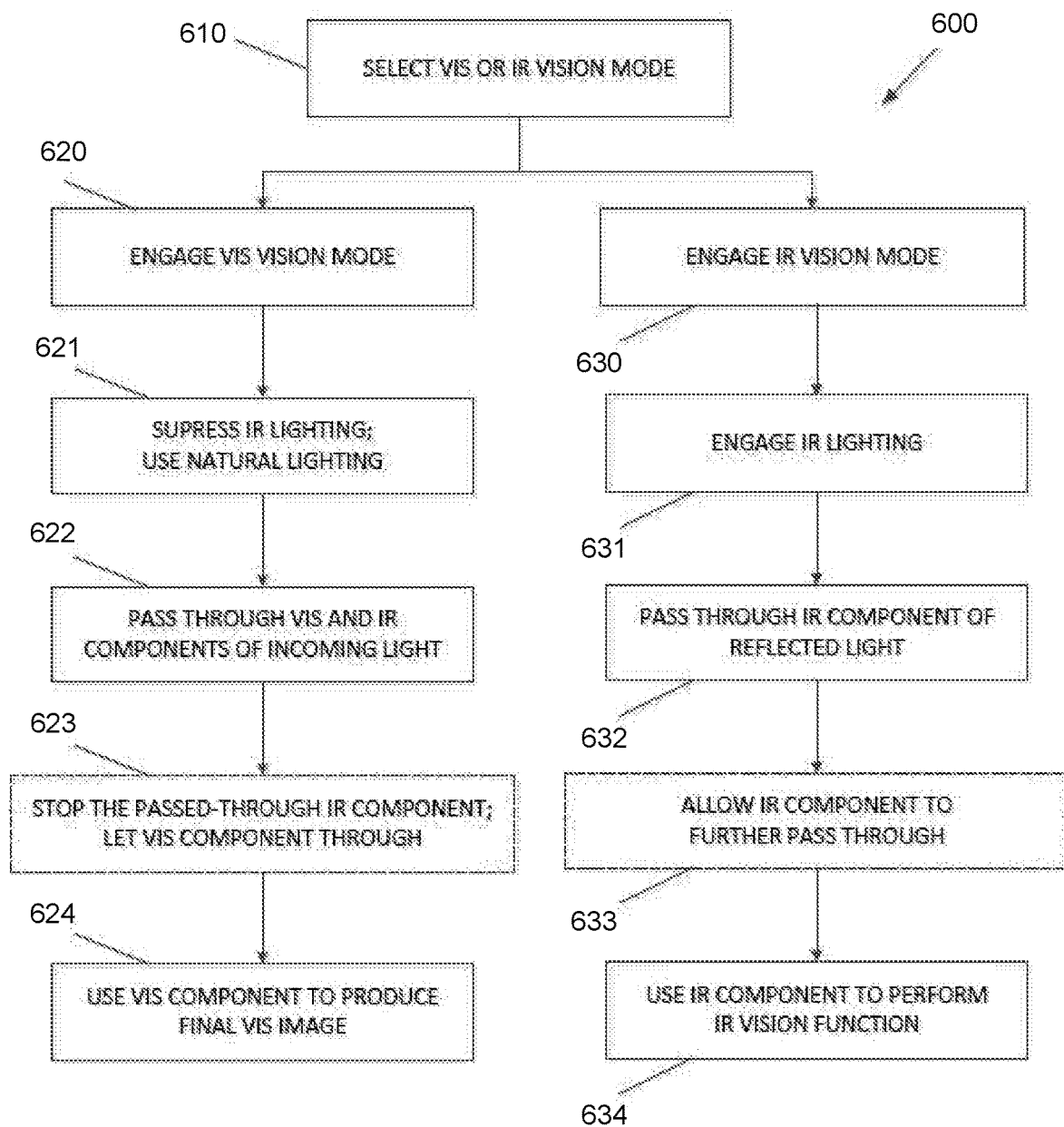
FIG. 6 shows an exemplary method that includes a number of steps to perform a VIS vision imaging mode and an IR vision imaging mode.

The several embodiments disclosed above may utilize a method of operation described herein. FIG. 6 shows an exemplary method 600, which includes a number of steps. The order of some of the steps need not be chronologically arranged. At step 610, a selection is made to engage either a VIS vision mode or an IR vision mode. Step 610 may be executed by the controller module 140 in FIG. 1A to select either the VIS mode 141 or the IR mode 142. If VIS mode 141 is selected to be engaged, as shown in step 620, then in a following step 621, IR lighting of an imaging subject is suppressed. This may be accomplished by keeping the IR light source 160 in FIG. 1A from being switched on. Natural lighting is used to illuminate the imaging subject for this VIS mode. The natural light reflecting off the imaging subject may include both VIS and IR spectral components. In step 622, the reflected natural light is filtered to allow specific VIS and IR bands to pass. For example, the VIS-IR filter 120 allows the broad VIS band 260 and the narrow IR band 270 to pass through VIS and IR components respectively, as shown in FIGS. 1A and 2A. Step 623 is optional, wherein the passed-through IR band 270 is stopped from reaching the underlying pixel array 130, particularly its VIS pixels 131, 132, and 133. For example, the selective IR filter 310 (see FIG. 3A and FIG. 5) has a stopband 405 (see FIG. 4A) that stops the IR noise that has passed through IR band 270. Finally, the leftover VIS component of the reflected natural light is used to form a final VIS image that is relatively free of IR noise influence.

If the IR mode 142 is selected to be engaged, as shown in step 630, then IR lighting is used in step 631 to illuminate the imaging subject. For example, the IR light source 160 in FIG. 1A may be switched on to emit rapid pulses of IR light towards the imaging subject. Due to the relatively high power of the IR pulses, the reflected light has a significant IR component, and the VIS spectrum may be regarded as low level noise. The IR mode 142 applies in both day and night, and works particularly well at low light conditions, including dark or foggy environments. In step 632, the IR component is allowed to pass through to reach the underlying pixel array. For example, the VIS-IR filter 120 (see FIG. 1A) allows the IR band 270 (see FIG. 2A) to pass through the reflected light's IR component. Step 633 is optional, wherein the passed-through IR light is allowed to further propagate to reach the sensing region of the underlying pixel array. For example, the IR pass filter 320 allows IR component to reach the imaging member 134c of the IR pixel 134 (see FIG. 3A and FIG. 5). Finally, the IR component is used to perform IR vision functions, such as distance measurement, object tracking, low light imaging, etc.

Fifth Embodiment: Combinations of Optical Filters and Special Filters

Figure 7A:
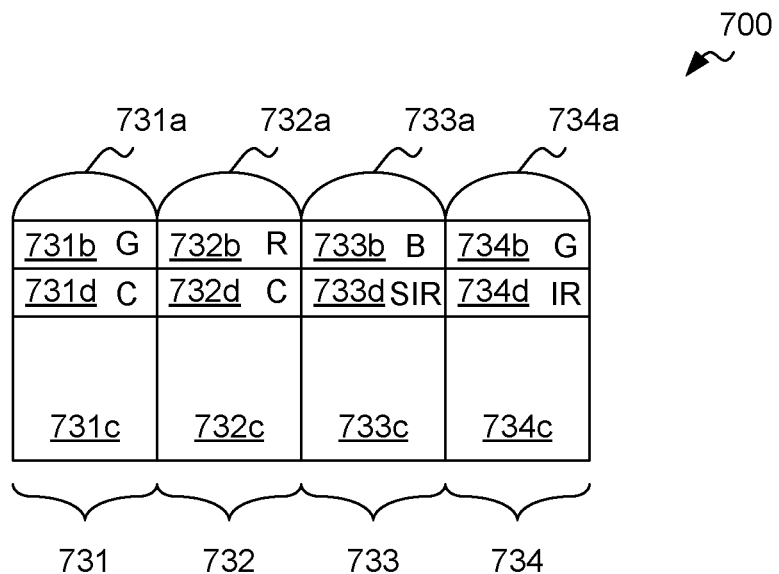
FIG. 7A shows an embodiment of a VIS-IR pixel array.

FIG. 7A shows an embodiment of the present invention similar to FIGS. 3A and 3B. A VIS-IR pixel array 700 comprises a green (G) pixel 731, a red (R) pixel 732, a blue (B) pixel 733, and an IR pixel 734. Although G pixel 731, R pixel 732, B pixel 733, and IR pixel 734 are shown in a linear arrangement in FIG. 7A, they may be arranged in a square-shaped, 2×2 pattern, as shown in FIG. 1B.

Pixel array 700 has the same components as the original pixel array 130 of FIG. 1A, including microlenses 731a through 734a (first through fourth microlens), optical filters 731b through 734b, and image sensing members 731c through 734c (first through fourth image sensing member). In addition, pixel array 700 includes special filters 731d through 734d. Special filters 731d through 734d include an IR filter similar to IR optical filter 134b, a clear filter (C), and an SIR (suppressed IR) filter similar to selective IR filter 310. A clear filter (C) passes both visible light and IR light. Although FIG. 7A shows optical filters 731b-734b overlying above special filters 731d-734d, optical filters 731b-734d may be underlying below special filters 731d-734d.

Figure 7B:
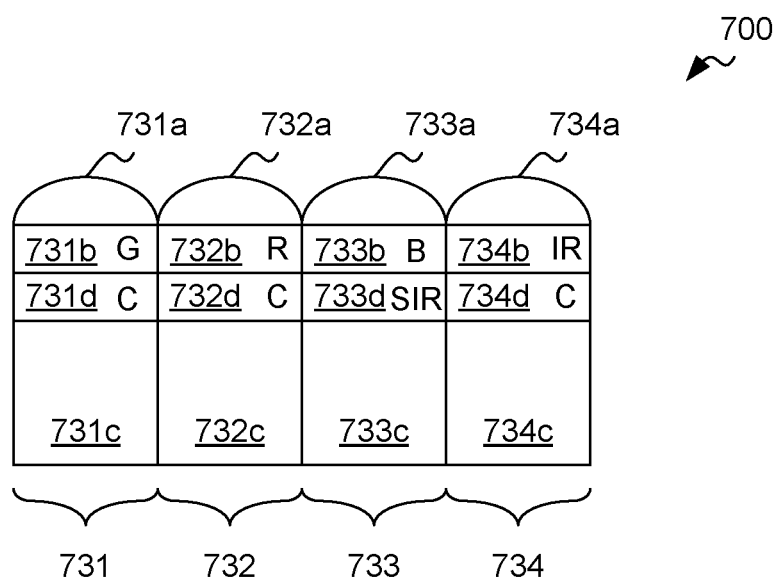
FIG. 7B shows an alternative embodiment of the VIS-IR pixel array of FIG. 7A.

In an embodiment shown in FIG. 7A, optical filters 731b (first G optical filter) and 734b (second G optical filter) are similar to G optical filter 131b, optical filter 732b is R optical filter similar to R optical filter 132b, and optical filters 733b is B optical filter similar to B optical filter 133b. Special filters 731d is a first clear filter (C). Special filter 732d (first special filter) is a second clear filter (C). First and second clear filter pass both visible light and IR light. Special filter 733d (second special filter) is a SIR filter similar to selective IR filter 310. Special filter 734d is an IR optical filter similar to IR optical filter 134b. In an embodiment, the thickness of optical filters 731b through 734b may be 0.7 µm, and the thickness of special filters 731d through 734d may be 1.0 µm. Alternatively, optical filter 734b may be IR optical filter similar to IR optical filter 134b, and special filter 734d may be a third clear filter as shown in FIG. 7B.

Optical filters 731b, 732b, and 733b have their own specific characteristic transmission curves, i.e., G transmission curve 220, R transmission curve 230, and B transmission curve 210 of FIG. 2B or 2C, respectively. In the embodiment of FIG. 7A, optical filter 734b is the same as optical filter 731b. In the embodiment of FIG. 7B, optical filter 734b is IR optical filter having IR transmission curve 240 of FIG. 2B or curve 260 of FIG. 2C. SIR filter 733d is similar to selective IR filter 310 having a characteristic transmission curve 400 of FIG. 4A or 4B. A clear filter (C) passes both visible light and IR light.

While selective IR filter 310 (SIR filter 733d) is a notched filter, also known as a bandstop filter, which stops light transmission within a certain stopband (e.g., 850±50 nm), and allows the rest of the spectrum to pass through it. According to FIG. 4A, the characteristic transmission curve 400 has a region of stopband 405, which is located at about 550-950 nm. Outside this stopband 405 region, light transmission is relatively high (e.g., 90-100%). Within this stopband 405, light transmission is significantly reduced. Further, at about 850 nm, light transmission is completely or partially stopped. The overall effectiveness of the stopband 405 depends on its bandwidth.

Figure 8A:
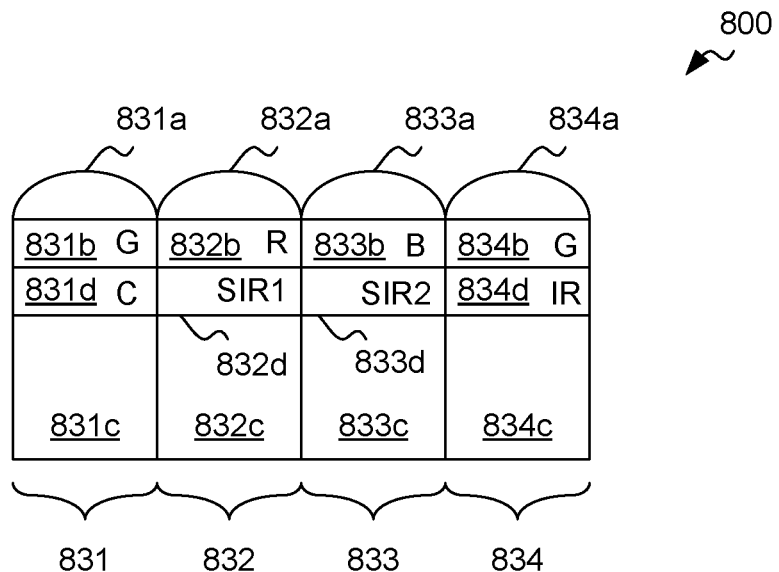
FIG. 8A shows another embodiment of a VIS-IR pixel array.

In another embodiment shown in FIG. 8A, a VIS-IR pixel array 800 of the present invention comprises a green (G) pixel 831, a red (R) pixel 832, a blue (B) pixel 833, and an IR pixel 834. Although G pixel 831, R pixel 832, B pixel 833, and IR pixel 834 are shown in a linear arrangement in FIG. 8A, they may be arranged in a square-shaped, 2×2 pattern, as shown in FIG. 1B.

Figure 8B:
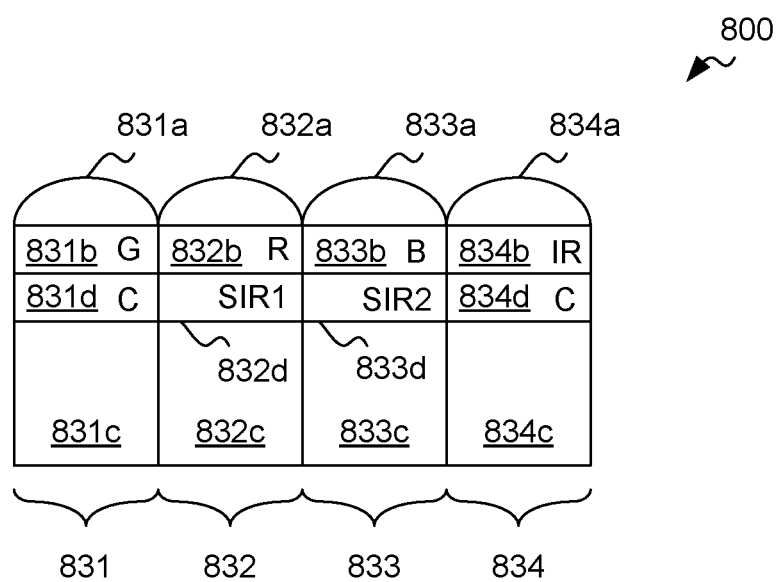
FIG. 8B shows an alternative embodiment of the VIS-IR pixel array of FIG. 8A.
Figure 9:
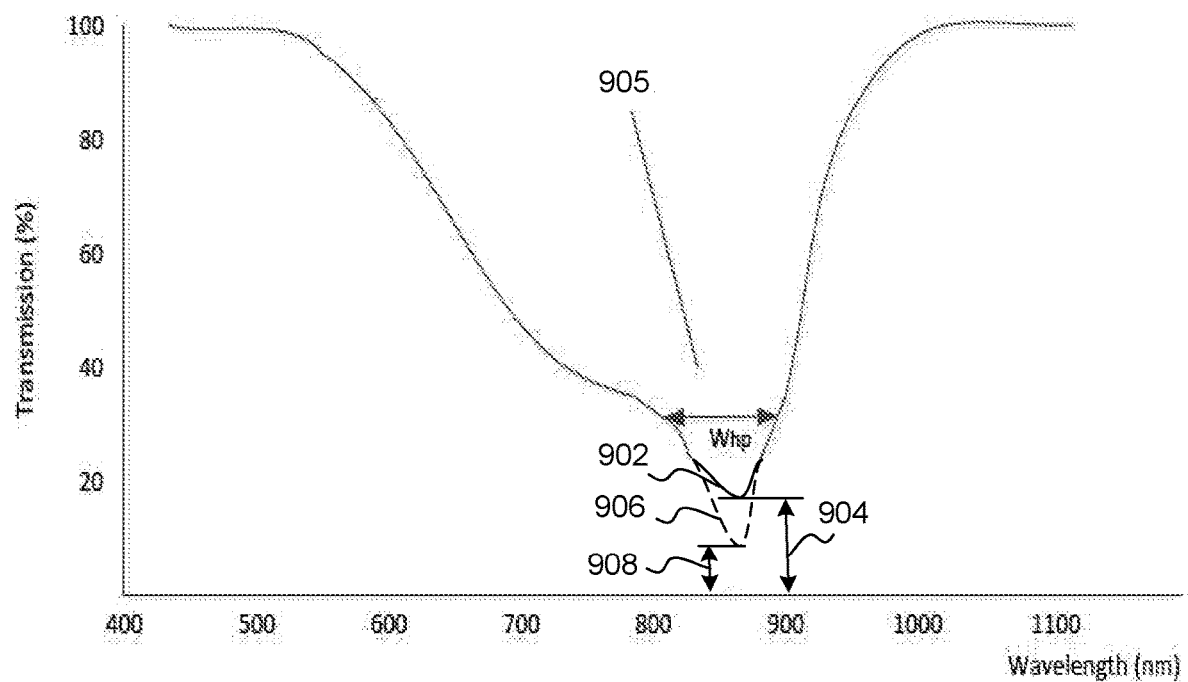
FIG. 9 is a wavelength versus transmission plot that shows two characteristic optical transmission curves of selected IR filters or suppressed IR (SIR) filters.

Optical filters 831b (first G optical filter) and 834b (second G optical filter) are similar to G optical filter 131b, optical filter 832b is R optical filter similar to R optical filter 132b, and optical filters 833b is B optical filter similar to B optical filter 113b. Special filter 831d is a first clear filter. Special filter 834d is IR optical filter similar to IR optical filter 134b. Special filter 832d (first special filter) is a special filter SIR1 filter similar to selective IR filter 310, however having an exemplary characteristic transmission curve 902 with a first minimum transmission 904 at a stopband 905 (e.g., 850±50 nm) as shown in FIG. 9. Special filter 833d (second special filter) is a SIR2 filter similar to selective IR cut filter 310, however having an exemplary characteristic transmission curve 906 with a second minimum transmission 908 at stopband 905 (e.g., 850±50 nm) as shown in FIG. 9. In an embodiment, the thickness of optical filters 831b through 834b may be 0.7 µm, and the thickness of special filters 831d through 834d may be 1.0 µm. Alternatively, optical filter 834b may be IR optical filter similar to IR optical filter 134b, and special filter 834d may be clear filter (third clear filter) as shown in FIG. 8B. Note there is no second clear filter in FIG. 8B.

The minimum transmission 904 is different from the minimum transmission 908. SIR1 filter and SIR2 filter may be made of different materials or different compositions of materials.

In this manner, transmission 904 at stopband 905 (e.g., 850±50 nm) of special filter 832d (first special filter) for red pixel 832 is different from transmission 908 at stopband 905 (e.g., 850±50 nm) of special filter 833d (second special filter) for blue pixel 833. Accordingly, the ratio of transmission 904 at stopband 905 (e.g., 850±50 nm) of special filter 832d (first special filter) to transmission in the passband 650-850 nm of optical filter 832b (R) is different from the ratio of transmission 908 at stopband 905 (e.g., 850±50 nm) of special filter 833d (second special filter) to transmission in the passband 380-450 nm of optical filter 833b (B). This would provide better color balance results, i.e., better balance among R, G, and B.

In other words, SIR1/R≠SIR2/B, where SIR1 is the transmission of IR at stopband 905 (e.g., 850±50 nm) of the special filter at the red pixel, R is the transmission of the red optical filter at the red pixel in the passband 650-850 nm, SIR2 is the transmission of IR at stopband 905 (e.g., 850±50 nm) of the special filter at the blue pixel, B is the transmission of the blue optical filter at the blue pixel in the passband 380-450 nm. For example, the transmission of the red optical filter at the red pixel in the passband 650-850 nm may be 50% (curve 230), and the transmission of the blue optical filter at the blue pixel in the passband 380-450 nm may be 70% (curve 210). In another embodiment, SIR1 may be the same as SIR2.

It is appreciated that VIS-IR pixel arrays 700 and 800 may replace VIS-IR pixel array 130 in FIG. 1A or VIS-IR pixel array 300 in FIG. 5 forming a hybrid VIS-IR image sensor system 100 or 500. Hybrid VIS-IR image sensor system 100 or 500 comprises a VIS-IR bandpass filter 121 having a transmission curve including a visible passband of 400-650 nm and an IR passband of 800-900 nm. VIS-IR pixel array 700 or 800 may be situated below VIS-IR bandpass filter 121. Hybrid VIS-IR image sensor system works in either VIS mode or IR mode. The VIS mode produces visible images and the IR mode produces IR images. Hybrid VIS-IR image sensor system also comprises a light source 160 for emitting light in the IR passband of 800-900 nm The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor system comprising:
   a pixel array that includes a multitude of minimal repeating units, each comprising:
   a green pixel comprising a first microlens, a first green optical filter, a first clear filter, and a first image sensing member;
   a red pixel comprising a second microlens, a red optical filter, a first special filter, and a second image sensing member;
   a blue pixel comprising a third microlens, a blue optical filter, a second special filter, and a third image sensing member;
   an IR pixel comprising a fourth microlens, an IR optical filter and a fourth image sensing member;
   wherein the first special filter is a filter that suppresses a transmission of IR at a stopband centered at 850 nm at a first IR minimum transmission, and the second special filter is a filter that suppresses a transmission of IR at the stopband centered at 850 nm at a second IR minimum transmission, and wherein the first minimum IR transmission is different from the second minimum IR transmission;
   wherein a ratio of the first IR minimum transmission to a red transmission in a passband 850-850 nm of the red optical filter is different from a ratio of the second IR transmission to a blue transmission in a passband 380-450 nm of the blue optical filter.

2. The image sensor system of claim 1, wherein the first special filter is a second clear filter, and the second special filter is a filter that suppresses a transmission of IR at the stopband centered at 850 nm at an IR minimum transmission.

3. The image sensor system of claim 1, wherein the first green optical filter, the red optical filter, and the blue optical filters are overlying above the first clear filter, the first special filter, and the second special filter, respectively.

4. The image sensor system of claim 1, wherein the first green optical filter, the red optical filter, and the blue optical filters are underlying below the first clear filter, the first special filter, and the second special filter, respectively.

5. The image sensor system of claim 1, the IR pixel further comprising a second green optical filter.

6. The image sensor system of claim 5, wherein the second green optical filter is overlying above the IR optical filter.

7. The image sensor system of claim 5, wherein the second green optical filter is underlying the IR optical filter.

8. The image sensor system of claim 1, the IR pixel further comprising a third clear filter.

9. The image sensor system of claim 8, wherein the IR optical filter is overlying above the third clear filter.

10. The image sensor system of claim 8, wherein the IR optical filter is underlying the third clear filter.

11. The image sensor system of claim 1 further comprising a VIS-IR bandpass filter having a transmission curve including a visible passband of 400-650 nm and an IR passband of 800-900 nm, wherein the pixel array is situated below the VIS-IR bandpass filter.

12. The image sensor system of claim 1, wherein the image sensor system works in one of a VIS mode and an IR mode, wherein the VIS mode produces visible images and the IR mode produces IR images.

13. The image sensor system of claim 12 further comprising a light source for emitting light in the IR passband of 800-900 nm.

14. The image sensor system of claim 1, wherein a thickness of the first green optical filter, the red optical filter, and the blue optical filter is 0.7 µm.

15. The image sensor system of claim 1, wherein a thickness of the first clear filter, the first special filter, and the second special filter is 1.0 µm.

16. A pixel array comprising:
   a green pixel comprising a first green optical filter and a first clear filter;
   a red pixel comprising a red optical filter and a first special filter;
   a blue pixel comprising a blue optical filter and a second special filter;
   an IR pixel comprising an IR optical filter and one of a second green optical filter and a second clear filter;
   wherein the first special filter suppresses a transmission of IR at a stopband centered at 850 nm at a first IR minimum transmission, and the second special filter suppresses a transmission of IR at the stopband centered at 850 nm at a second IR minimum transmission, and wherein the first minimum IR transmission is different from the second minimum IR transmission;
   wherein a ratio of the first IR minimum transmission to a red transmission in a passband 850-850 nm of the red optical filter is different from a ratio of the second IR transmission to a blue transmission in a passband 380-450 nm of the blue optical filter.

17. A pixel array comprising:
   a green pixel comprising a first green optical filter and a first clear filter;
   a red pixel comprising a red optical filter and a second clear filter;
   a blue pixel comprising a blue optical filter and a special filter;
   an IR pixel comprising an IR optical filter and one of a second green optical filter and a third clear filter;
   wherein the first special filter is a filter that suppresses a transmission of IR at a stopband centered at 850 nm at a first IR minimum transmission, and the second special filter is a filter that suppresses a transmission of IR at the stopband centered at 850 nm at a second IR minimum transmission, and wherein the first minimum IR transmission is different from the second minimum IR transmission;

wherein a ratio of the first IR minimum transmission to a red transmission in a passband 850-850 nm of the red optical filter is different from a ratio of the second IR transmission to a blue transmission in a passband 380-450 nm of the blue optical/filter.

* * * * *